United States Patent
Kwon et al.

(10) Patent No.: US 8,130,012 B2
(45) Date of Patent: Mar. 6, 2012

(54) BUFFER CIRCUIT OF SEMICONDUCTOR INTEGRATED APPARATUS

(75) Inventors: Jae-Kwan Kwon, Ichon (KR); Sung-Joo Ha, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/346,213

(22) Filed: Dec. 30, 2008

(65) Prior Publication Data

US 2009/0230997 A1  Sep. 17, 2009

(30) Foreign Application Priority Data

Mar. 12, 2008 (KR) ........................ 10-2008-0023028

(51) Int. Cl.
*H03K 3/00* (2006.01)
(52) U.S. Cl. ........................................................ 327/108
(58) Field of Classification Search .................. 327/108
See application file for complete search history.

(56) References Cited

U.S. PATENT DOCUMENTS

| | | | | |
|---|---|---|---|---|
| 5,585,763 A * | 12/1996 | Navabi et al. | ............... | 330/255 |
| 5,592,121 A * | 1/1997 | Jung et al. | ............... | 327/541 |
| 5,734,279 A * | 3/1998 | Bereza | ............... | 327/112 |
| 5,955,908 A * | 9/1999 | Tam | ............... | 327/315 |
| 6,188,254 B1 | 2/2001 | Choi | | |
| 6,567,327 B2 * | 5/2003 | Tsuchi | ............... | 365/203 |
| 6,654,310 B2 | 11/2003 | Nam | | |
| 6,670,836 B1 * | 12/2003 | Zivanovic | ............... | 327/170 |
| 7,053,661 B1 * | 5/2006 | Butka | ............... | 326/87 |
| 7,176,910 B2 * | 2/2007 | Tsuchi | ............... | 345/204 |
| 7,224,194 B2 * | 5/2007 | Lee | ............... | 327/112 |
| 7,336,109 B2 | 2/2008 | Lambrache | | |
| 2002/0093366 A1 * | 7/2002 | Fotouhi | ............... | 327/108 |
| 2004/0257126 A1 * | 12/2004 | Choi et al. | ............... | 327/108 |
| 2007/0080723 A1 * | 4/2007 | Lee et al. | ............... | 327/112 |

FOREIGN PATENT DOCUMENTS

| | | |
|---|---|---|
| KR | 1019990070496 | 9/1999 |
| KR | 1020080001850 | 1/2008 |

* cited by examiner

*Primary Examiner* — Lincoln Donovan
*Assistant Examiner* — Khareem E Almo
(74) *Attorney, Agent, or Firm* — Baker & McKenzie LLP (57) ABSTRACT

A buffer circuit of a semiconductor integrated apparatus includes a control block configured to output a result of comparing an input voltage level and an output voltage level as a control signal, and a buffering block configured to generate an output voltage having the substantially same level as an input voltage in response to the control signal.

6 Claims, 6 Drawing Sheets

BUFFER CIRCUIT OF SEMICONDUCTOR INTEGRATED APPARATUS

CROSS-REFERENCES TO RELATED APPLICATION

The present application claims priority under 35 U.S.C. §119(a) to Korean application number 10-2008-0023028, filed on Mar. 12, 2008, in the Korean Intellectual Property Office, which is incorporated herein by reference in its entirety as set forth in full.

BACKGROUND

1. Technical Field

The embodiments described herein relate to a semiconductor integrated apparatus, and more particularly, to a buffer circuit of a semiconductor integrated apparatus.

2. Related Art

In general, a buffer circuit of a semiconductor integrated apparatus is provided to supply a stabilized voltage to an internal circuit. Here, the buffer circuit is configured to receive a reference voltage and generate an internal voltage having the same level as the reference voltage.

Figure 1:
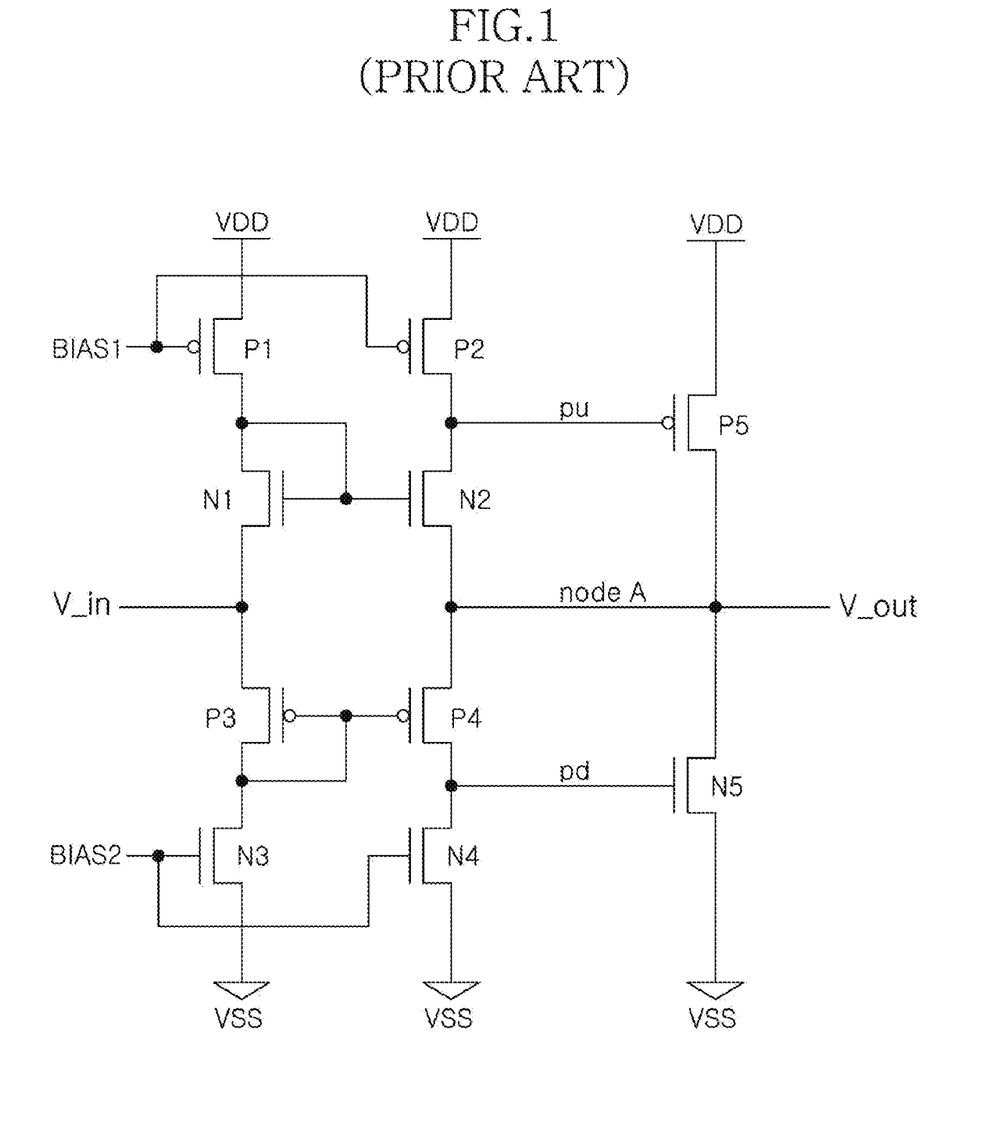
FIG. 1 is a schematic circuit diagram of a conventional buffer circuit of a semiconductor integrated apparatus.

FIG. 1 is a schematic circuit diagram of a conventional buffer circuit of a semiconductor integrated apparatus. In FIG. 1, a buffer circuit 10 has a current mirror structure receiving an input voltage V_in from an exterior of the buffer circuit 10 and generating a stable output voltage V_out. The buffer circuit 10 includes first to tenth transistors P1 to P5 and N1 through N5. The first and second transistors P1 and P2 receive a first bias voltage BIAS1 through gate terminals and a supply voltage 'VDD' through source terminals, and output a constant voltage through drain terminals. The third and fourth transistors N1 and N2 have gate terminals connected to a common node, and are connected to the drains of the first and second transistors P1 and P2, and receive the constant voltage. Here, the gate and drain terminals of the third transistor N1 are connected with each other, and therefore, the gate and drain terminals of the third transistor N1 and the gate terminal of the fourth transistor N2 receive the same potential level.

The fifth and sixth transistors P3 and P4 have source terminals to which the source terminals of the third and fourth transistors N1 and N2 are connected, and gate terminals connected to a common node. Here, the gate and drain terminals of the fifth transistor P3 are connected with each other. The seventh and eighth transistors N3 and N4 receive a second bias voltage BIAS2 through gate terminals, and have drain terminals connected to the drain terminals of the fifth and sixth transistors P3 and P4 and source terminal connected to a ground voltage 'VSS'.

The input voltage V_in is supplied to a node to which the third transistor N1 and the fifth transistor P3 are connected, and an output node A, from which the output voltage V_out is output, is connected to a node to which the fourth transistor N2 and the sixth transistor P4 are connected. In addition, a pull-up signal 'pu' is output from a node to which the second transistor P2 and the fourth transistor N2 are connected, and a pull-down signal 'pd' is output from a node to which the sixth transistor P4 and the eighth transistor N4 are connected.

The ninth transistor P5 has a gate terminal through which the pull-up signal 'pu' is input and a source terminal to which the supply voltage 'VDD' is supplied. The tenth transistor N5 has a gate terminal through which the pull-down signal 'pd' is input, a drain terminal to which the drain terminal of the ninth transistor P5 is connected, and a source terminal which is connected to the ground voltage 'VSS'. At this time, the output node A is connected to a node to which the ninth transistor P5 and the tenth transistor N5 are connected.

In the buffer circuit 10, if the level of the input voltage V_in increases, then the potential level of the pull-up signal 'pu' decreases, and the turn-ON of the ninth transistor P5 quickly occurs. Accordingly, the level of the output voltage V_out increases. Conversely, if the level of the input voltage V_in decreases, then the potential level of the pull-down signal 'pd' increases, and the turn-ON of the tenth transistor N5 quickly occurs. Accordingly, the level of the output voltage V_out decreases.

However, buffer circuit 10 suffers from defects in that, since it is composed of the transistors, as described above, it is influenced by process variations.

A normal buffer circuit must generate the output voltage V_out having the same level as the input voltage V_in. Accordingly, by measuring the level of the output voltage V_out in response to the input voltage V_in, as can be readily seen from FIG. 2, the level of the input voltage V_in and the level of the output voltage V_out do not correspond to each other. This non-correspondence in the levels of the input and output voltages V_in and V_out results from changes in the sizes of the ninth and tenth transistors P5 and N5 that function to actually perform pull-up and pull-down operations in the buffer circuit 10. Here, the sizes of transistors are determined by photolithographic processes. Accordingly, as semiconductor integrated apparatuses trend toward fine formation, errors are likely to occur while conducting the photolithographic processes. Thus, the sizes of transistors may deviate from a predetermined range.

Figure 2:
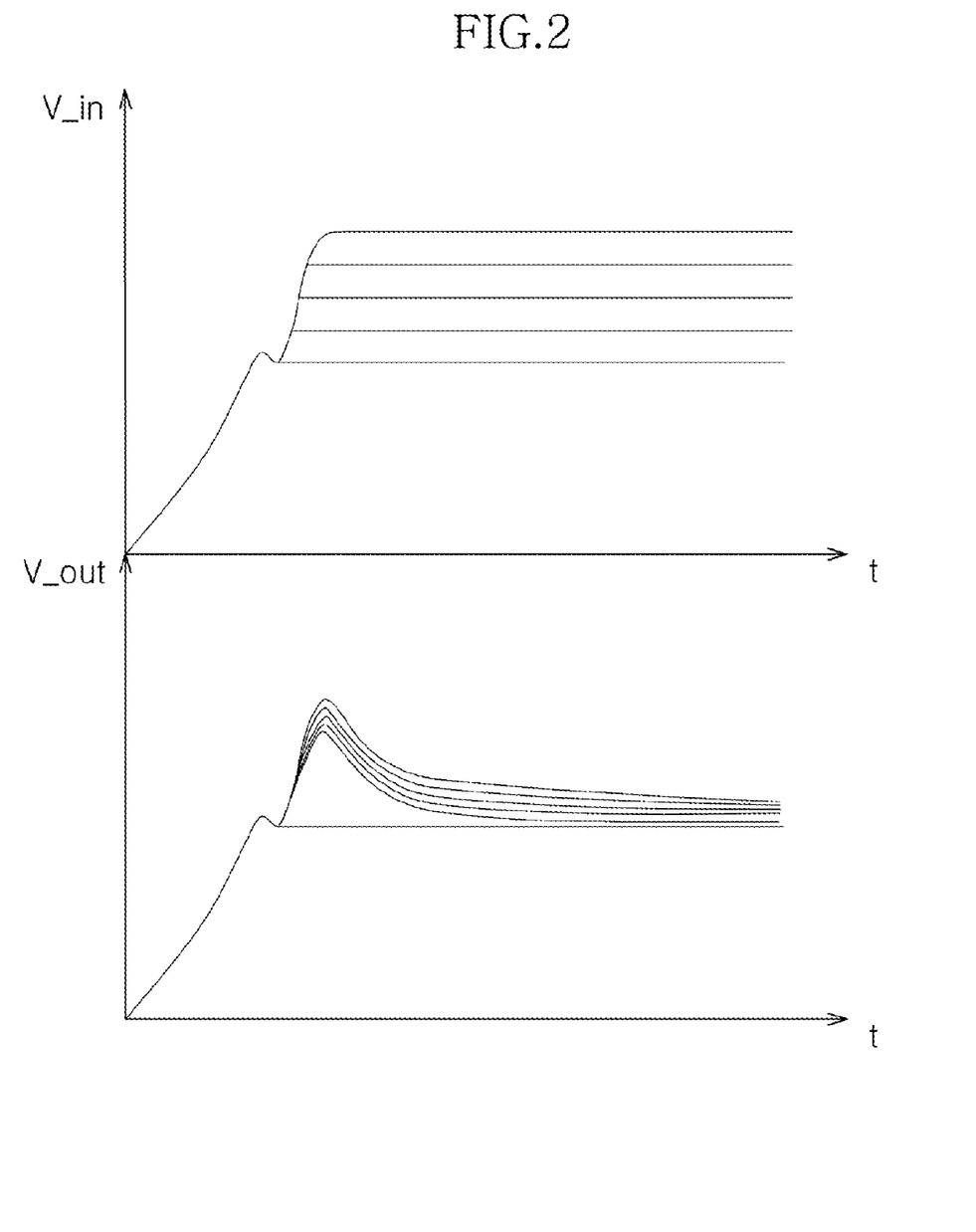
FIG. 2 are graphs representing input signal levels and output signal levels of the buffer circuit of FIG. 1.

For example, if the tenth transistor N5 is formed large relative to the other transistors due to the process variations, as can be readily seen from the graph of FIG. 2, the level of the output voltage V_out decreases compared to the level of the input voltage V_in. On the contrary, if the ninth transistor P5 is formed large relative to the other transistors, then the level of the output voltage V_out increases compared to the level of the input voltage V_in.

Thus, in the buffer circuit 10, it is difficult to generate precisely an internal voltage.

SUMMARY

A buffer circuit of a semiconductor integrated apparatus capable of generating an output voltage having the same level as an input voltage without being influenced by a process variation is described herein.

In one aspect, a buffer circuit of a semiconductor integrated apparatus includes a control block configured to output a result of comparing an input voltage level and an output voltage level as a control signal, and a buffering bock configured to generate an output voltage having substantially the same level as an input voltage in response to the control signal.

In another aspect, a buffer circuit of a semiconductor integrated apparatus includes a pull-up unit configured to perform a pull-up operation depending upon a potential level of a pull-up signal and increase a level of an output voltage, a pull-down unit configured to perform a pull-down operation depending upon a potential level of a pull-down signal and decrease the level of the output voltage, and a control block configured to generate a control signal for selectively driving the pull-up unit and the pull-down unit.

In another aspect, a semiconductor integrated circuit includes a buffer circuit configured to compare an input voltage level and an output voltage level and output a control signal based upon the comparison, and to generate an output voltage having substantially the same level as an input voltage in response to the control signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 3:
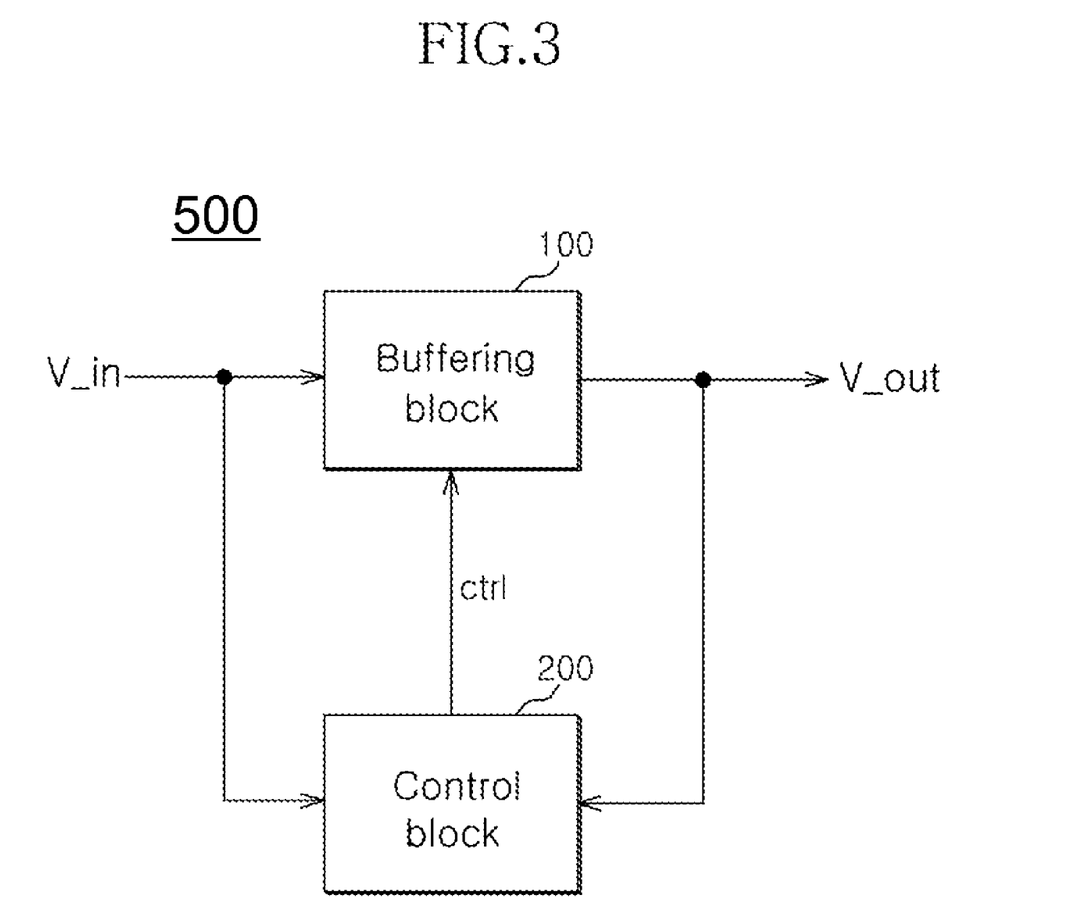
FIG. 3 is a schematic block diagram of an exemplary buffer circuit of a semiconductor integrated apparatus according to one embodiment.

FIG. 3 is a schematic block diagram of an exemplary buffer circuit of a semiconductor integrated apparatus according to one embodiment. In FIG. 3, a buffer circuit 500 can include a buffering block 100 and a control block 200.

The buffering block 100 can be configured to output an output voltage V_out having substantially the same level as an input voltage V_in in response to a control signal 'ctrl' transmitted from the control block 200.

The control block 200 can compare the levels of the input voltage V_in and the output voltage V_out, and can output the control signal 'ctrl' indicating a comparison result.

Figure 4:
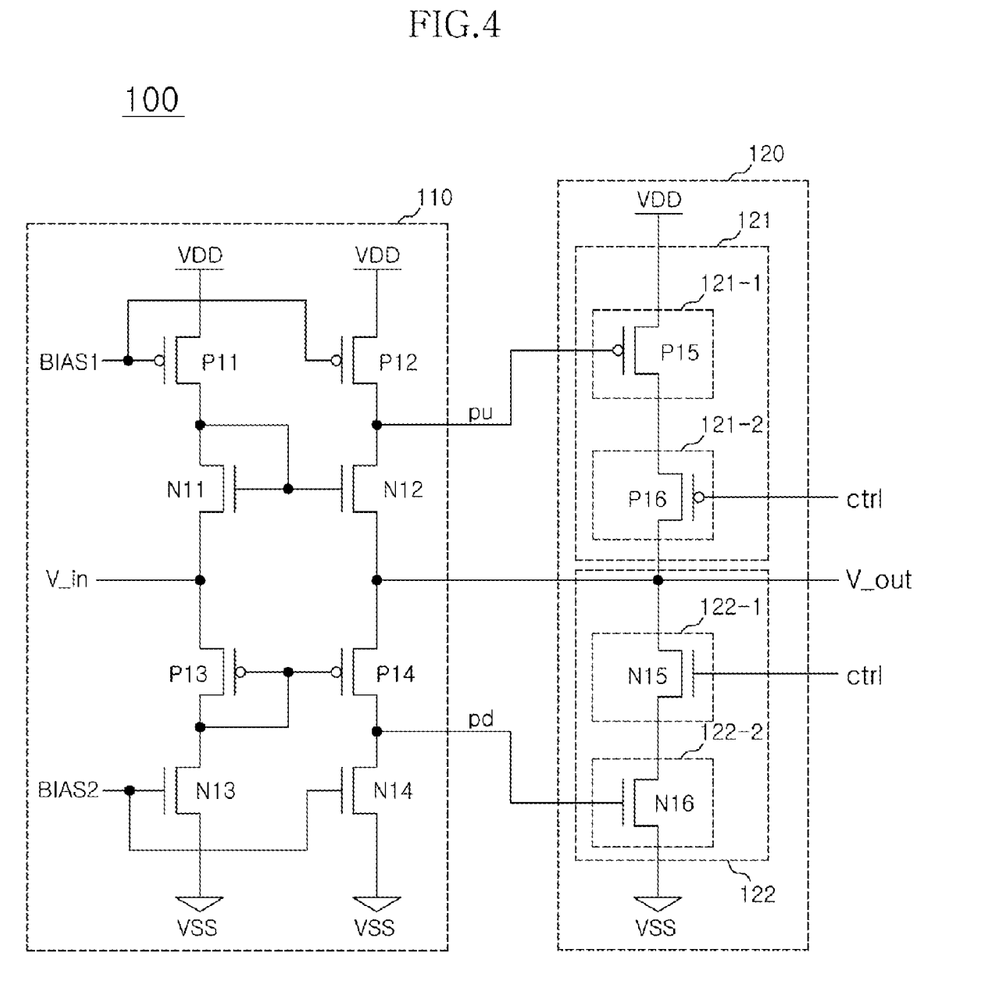
FIG. 4 is a schematic circuit diagram of an exemplary buffering block capable of being implemented in the apparatus of FIG. 3 according to one embodiment.

FIG. 4 is a schematic circuit diagram of an exemplary buffering block capable of being implemented in the apparatus of FIG. 3 according to one embodiment. In FIG. 4, the buffering block 100 can include a signal generation section 110 and a voltage output section 120 as shown in FIG. 4.

The signal generation section 110 can be configured to generate a pull-up signal 'pu' and a pull-down signal 'pd' depending upon the level of the input voltage V_in. For example, the signal generation section 110 can include first to eighth transistors N11 to N14 and P11 to P14. The first transistor N11 can receive the input voltage V_in through a source terminal, and gate and drain terminals of the first transistor N11 can be connected with each other. The second transistor N12 can have a gate terminal to which the gate terminal of the first transistor N11 can be connected and a source terminal receiving the output voltage V_out.

The third transistor P11 can have a gate terminal receiving a first bias voltage BIAS1, a source terminal receiving a supply voltage VDD, and a drain terminal to which the drain terminal of the first transistor N11 can be connected. The fourth transistor P12 can have a gate terminal receiving the first bias voltage BIAS1, a source terminal receiving the supply voltage VDD, and a drain terminal to which the drain terminal of the second transistor N12 can be connected.

The fifth transistor P13 can have a gate terminal and a drain terminal which are connected with each other and a source terminal to which the source terminal of the first transistor N11 can be connected. The sixth transistor P14 can have a gate terminal to which the gate terminal of the fifth transistor P13 can be connected, and a source terminal to which the source terminal of the second transistor N12 can be connected.

The seventh transistor N13 can have a gate terminal receiving a second bias voltage BIAS2, a drain terminal to which the drain terminal of the fifth transistor P13 can be connected, and a source terminal to which the terminal of a ground voltage VSS can be connected. The eighth transistor N14 can have a gate terminal receiving the second bias voltage BIAS2, a drain terminal to which the drain terminal of the sixth transistor P14 can be connected, and a source terminal to which the terminal of the ground voltage VSS can be connected.

Accordingly, the pull-up signal 'pu' can be output from a node to which the second transistor N12 and the fourth transistor P12 are connected, and the pull-down signal 'pd' can be output from a node to which the sixth transistor P14 and the eighth transistor N14 are connected.

In addition, the pull-up signal 'pu' and the pull-down signal 'pd' can be generated by comparing the levels of the input voltage V_in and the output voltage V_out in the signal generation section 110. Here, setting can be made such that, when the level of the input voltage V_in is higher than the level of the output voltage V_out, the potential level of the pull-up signal 'pd' can decrease. Conversely, when the level of the input voltage V_in is lower than the level of the output voltage V_out, the potential level of the pull-down signal 'pd' can increase.

In FIG. 3, the voltage output section 120 can perform pull-up and pull-down operations depending upon the levels of the pull-up signal 'pu' and the pull-down signal 'pd', and can adjust the level of the output voltage V_out. Here, the pull-up operation and the pull-down operation can be controlled depending upon whether the control signal 'ctrl' is enabled.

In FIG. 3, the voltage output section 120 can include a pull-up unit 121 and a pull-down unit 122. The pull-up unit 121 can be configured such that, when the control signal 'ctrl' is enabled, the pull-up unit 121 can perform the pull-up operation depending upon the potential level of the pull-up signal 'pu' and increases the level of the output voltage V_out. For example, the pull-up unit 121 can include a pull-up driver 121-1 and a first switching part 121-2.

The pull-up driver 121-1 can switch the supply voltage VDD depending upon the potential level of the pull-up signal 'pu'. For example, the pull-up driver 121-1 can include a ninth transistor P15 having a gate terminal receiving the pull-up signal 'pu' and a source terminal receiving the supply voltage VDD.

When the control signal 'ctrl' is enabled to a low level, the first switching part 121-2 can provide the output of the pull-up driver 121-1 as the output voltage V_out. For example, the first switching part 121-2 can include a tenth transistor P16 having a gate terminal receiving the control signal 'ctrl', a drain terminal receiving the output of the pull-up driver 121-1, and a source terminal to which the terminal of the output voltage V_out can be connected.

The pull-down unit 122 can include a second switching part 122-1 and a pull-down driver 122-2. The second switching part 122-1 can be configured to transmit the output voltage V_out to the pull-down driver 122-2 when the control signal 'ctrl' is disabled to a high level. For example, the second switching part 122-1 can include an eleventh transistor N15 having a gate terminal receiving the control signal 'ctrl', a source terminal receiving the output voltage V_out, and a drain terminal to which the pull-down driver 122-2 can be connected.

The pull-down driver 122-2 can guide the output of the second switching part 122-1 to the terminal of the ground voltage VSS in response to the potential level of the pull-down signal 'pd'. For example, the pull-down driver 122-2 can include a twelfth transistor N16 having a gate terminal receiving the pull-down signal 'pd', a drain terminal to which the output of the second switching part 122-1 can be supplied, and a source terminal to which the terminal of the ground voltage VSS can be connected.

Figure 5:
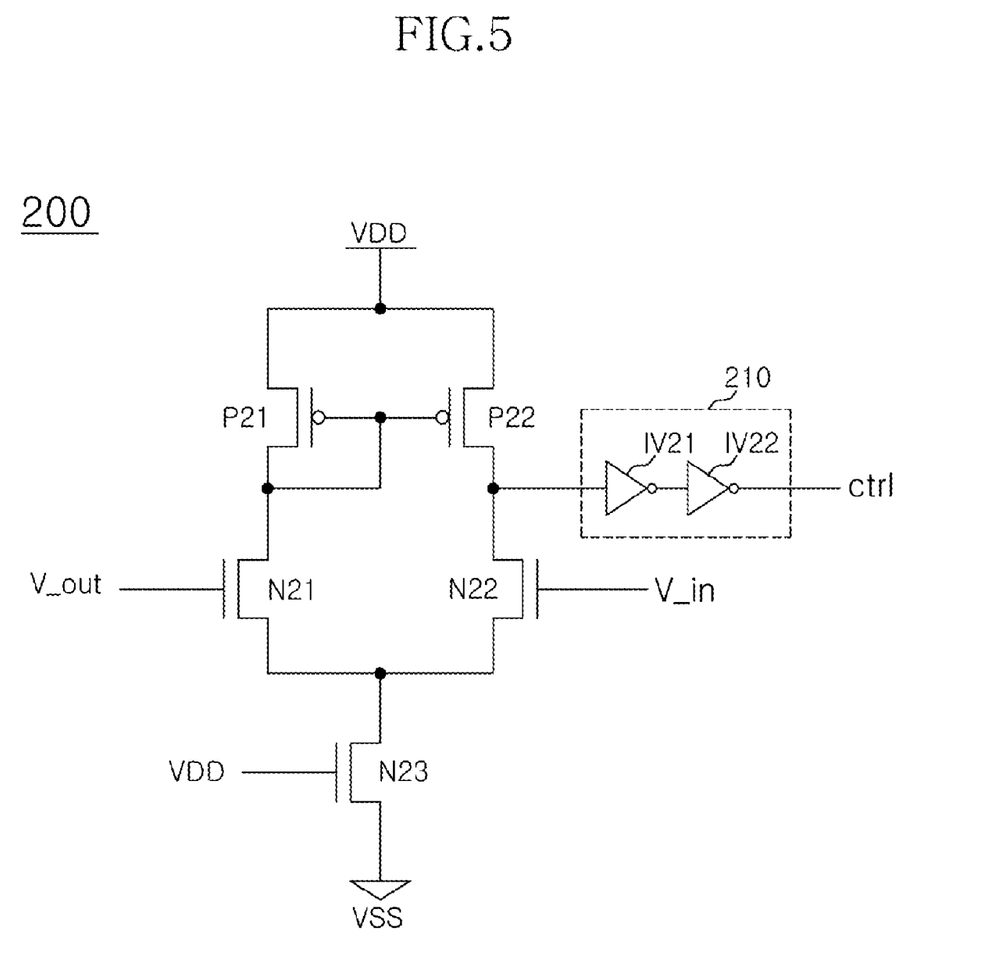
FIG. 5 is a schematic circuit diagram of an exemplary control block capable of being implemented in the block of FIG. 3 according to one embodiment.

FIG. 5 is a schematic circuit diagram of an exemplary control block capable of being implemented in the block of FIG. 3 according to one embodiment. In FIG. 5, the control block 200 can be configured to compare the levels of the input voltage V_in and the output voltage V_out and to generate the control signal 'ctrl'. For example, the control block 200 can be configured in the shape of a current mirror-type comparator.

The control block 200 having the shape of a current mirror-type comparator can include thirteenth to seventeenth transistors N21 to N23, P21, and P22. The thirteenth transistor N21 can have a gate terminal receiving the output voltage V_out, and the fourteenth transistor N22 can have a gate terminal receiving the input voltage V_in. In addition, the fifteenth transistor N23 can have a gate terminal receiving the supply voltage VDD, a drain terminal to which a node having the thirteenth transistor N21 and the fourteenth transistor N22 connected thereto can be connected, and a source terminal to which the terminal of the ground voltage VSS can be connected. The sixteenth transistor P21 can have a gate terminal and a drain terminal to which the drain of the thirteenth transistor N21 can be connected, and a source terminal receiving the supply voltage VDD. The seventeenth transistor P22 can have a gate terminal to which the gate terminal of the sixteenth transistor P21 can be connected, a source terminal receiving the supply voltage VDD, and a drain terminal to which the drain of the fourteenth transistor N22 can be connected.

In FIG. 5, the control block 200 can further include a driver 210 that can buffer a signal output from a node to which the fourteenth transistor N22 and the seventeenth transistor P22 are connected. For example, the driver 210 can include first and second inverters IV21 and IV22 connected in series.

An exemplary operation of the buffer circuit of a semiconductor integrated apparatus will be described with reference to FIGS. 3-5.

When the level of the input voltage V_in is higher than the level of the output voltage V_out, the control block 200 can output the control signal 'ctrl' having a low level. Then, the control signal 'ctrl' having the low level can be input to the buffering block 100. Since the first switching part 121-1 of the pull-up unit 121 is turned ON, the pull-up unit 121 can output a pulled-up voltage as the output voltage V_out. Here, since the second switching part 122-1 of the pull-down unit 122 is turned OFF, the pull-down unit 122 does not perform the pull-down operation.

In addition, when the level of the output voltage V_out is higher than the level of the input voltage V_in, the control block 200 can output the control signal 'ctrl' having a high level. Accordingly, the control signal 'ctrl' having the high level can be input to the buffering block 100. Since the second switching part 122-1 of the pull-down unit 122 is turned ON, the pull-down unit 122 can pull down the output voltage V_out. Here, since the first switching part 121-1 of the pull-up unit 121 is turned OFF, the pull-up unit 121 does not perform the pull-up operation.

If the pull-up driver for performing the pull-up operation or the pull-down driver for performing the pull-down operation has a size different from that originally designed, then the level of the output voltage V_out changes. However, since the pull-up operation and the pull-down operation are selectively performed in response to the control signal 'ctrl' that is generated by comparing the levels of the input voltage V_in and the output voltage V_out, the level of the output voltage V_out is not substantially influenced by the sizes of the pull-up driver 121-1 and the pull-down driver 122-2.

Figure 6:
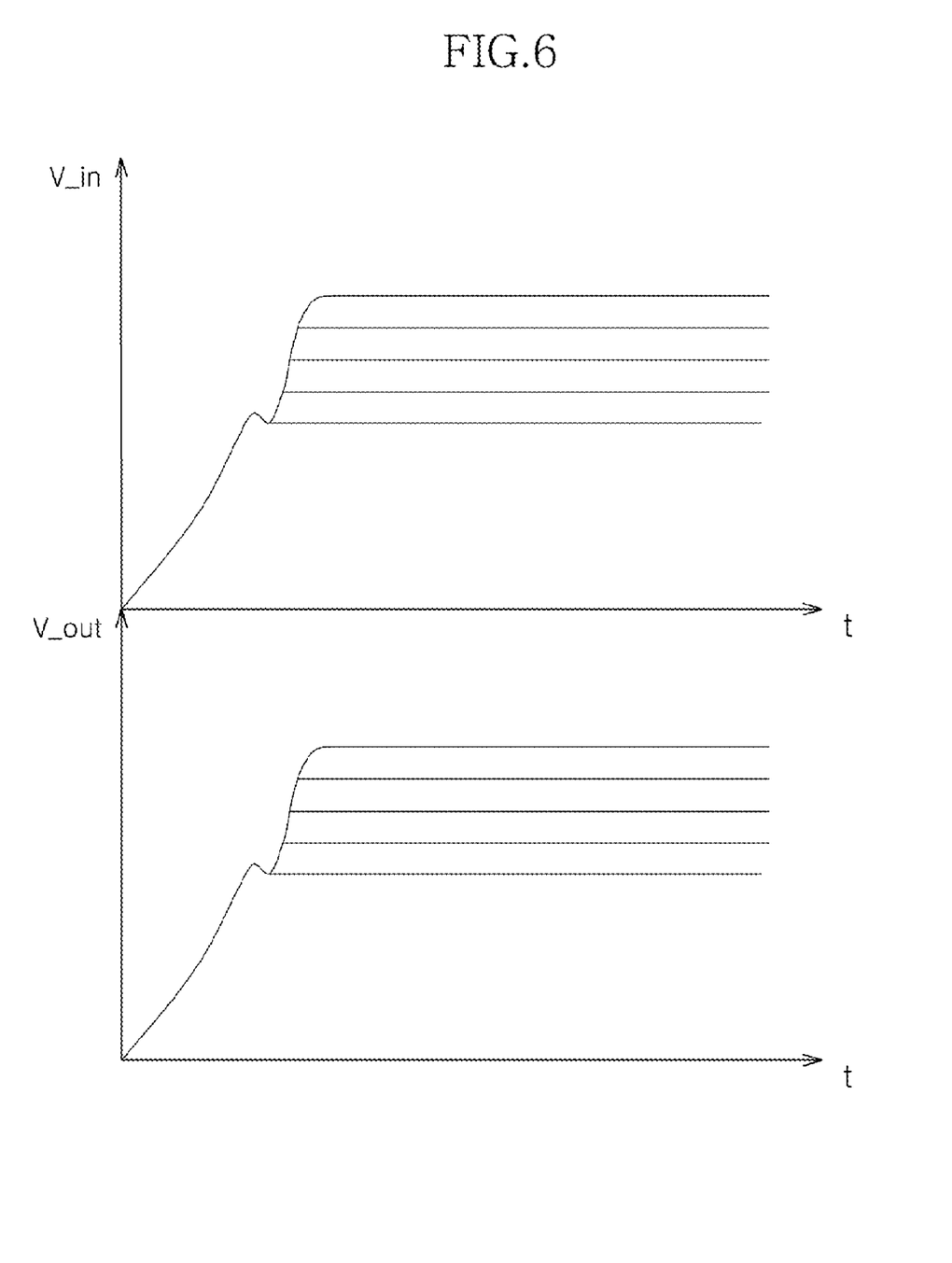
FIG. 6 are graphs representing exemplary input signal levels and output signal levels of the buffer circuit of FIG. 3 according to one embodiment.

FIG. 6 are graphs representing exemplary input signal levels and output signal levels of the buffer circuit of FIG. 3 according to one embodiment. In FIG. 6, the levels of the input voltage V_in and the output voltage V_out are buffered, wherein even when the sizes of the pull-up driver 121-1 and the pull-down driver 122-2 change, the levels of the input voltage V_in and the output voltage V_out are substantially the same.

Accordingly, the buffer circuit of a semiconductor integrated apparatus can control pull-up and pull-down operations, and can generate an output voltage having substantially the same level as an input voltage irrespective of process variations, whereby voltage stabilization of a semiconductor memory apparatus can be accomplished. In addition, power consumption can be reduced.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:
1. A buffer circuit of a semiconductor integrated apparatus, comprising:
  a control block configured to compare an input voltage level and an output voltage level and output the result as a control signal; and
  a buffering block including:
    a signal generation section configured to receive a first bias voltage and a second bias voltage and to generate a pull-up signal and a pull-down signal in response to the input voltage level, and
    a voltage output section configured to the generate the output voltage in response to the pull-up signal, the pull-down signal, and the control signal,
  wherein the voltage output section includes:
    a pull-up unit configured to perform a pull-up operation in response to the control signal and the pull-up signal, and
    a pull-down unit configured to perform a pull-down operation in response to the control signal and the pull-down signal,
  wherein the pull-up unit includes:
    a pull-up driver configured to receive the pull-up signal and to connect with a supply voltage terminal, and
    a first switching part configured to receive the control signal, to connect with the pull-up driver, and to provide an output voltage of the pull-up driver as the output voltage of the buffering block when the control signal is enabled, wherein the pull-down unit comprises:
- a second switching part configured to connect with the first switching part and to transmit the output voltage of the pull-up driver when the control signal is disabled, and
- a pull-down driver configured to connect with the second switching part and to provide an output of the second switching part to a ground terminal depending upon a potential level of the pull-down signal, and wherein the control block has a single output node that is directly connected to both the first and the second switching parts.

2. The buffer circuit of claim 1, wherein the control block is configured to generate an enabled control signal when the output voltage level is lower than the input voltage level and a disabled control signal when the output voltage level is higher than the input voltage level.

3. The buffer circuit of claim 2, wherein the control block has a driver that drives and outputs the control signal.

4. A buffer circuit of a semiconductor integrated apparatus, comprising:
- a pull-up unit configured to perform a pull-up operation depending upon a potential level of a pull-up signal and increase a level of an output voltage;
- a pull-down unit configured to perform a pull-down operation depending upon a potential level of a pull-down signal and decrease the level of the output voltage; and
- a control block configured to generate a control signal for selectively driving the pull-up unit and the pull-down unit, wherein the pull-up unit includes:
- a pull-up driver configured to receive the pull-up signal and to connect with a supply voltage terminal, and
- a first switching part configured to receive the control signal, to connect with the pull-up part, and to output an output voltage of the pull-up driver when the control signal is enabled, wherein the pull-down unit comprises:
- a second switching part configured to connect with the first switching part and to output the output voltage of the pull-up driver when the control signal is disabled, and
- a pull-down driver configured to connect with the second switching part and to perform the pull-down operation for guiding an output of the switching part to a ground terminal, depending upon a potential level of the pull-down signal, and wherein the control block has a single output node that is directly connected to both the first and the second switching parts.

5. The buffer circuit of claim 4, wherein the control block is configured to compare a level of an input voltage and the level of the output voltage and generate the control signal.

6. The buffer circuit of claim 5, wherein the control block disables the control signal when the level of the output voltage is higher than the level of the input voltage and enables the control signal when the level of the output voltage is lower than the level of the input voltage.

* * * * *